(12) United States Patent  
Cobb

(10) Patent No.: US 7,158,306 B1  
(45) Date of Patent: Jan. 2, 2007

(54) LIGHT SEPARATOR

(75) Inventor: Joshua M Cobb, Victor, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/292,405

(22) Filed: Nov. 30, 2005

(51) Int. Cl.
G02B 27/10 (2006.01)
G02B 27/14 (2006.01)

(52) U.S. Cl. ...................................... 359/618; 359/634
(58) Field of Classification Search ................ 359/618, 359/625, 627, 629, 634, 636, 638, 834
See application file for complete search history.

(56) References Cited

U.S. PATENT DOCUMENTS

| | | | |
|---|---|---|---|
| 1,853,007 A | 4/1932 | Troland | 280/326 |
| 2,949,498 A | 8/1960 | Jackson | 136/244 |
| 3,202,039 A | 8/1965 | DeLang et al. | 348/256 |
| 5,098,183 A | 3/1992 | Sonehara | 353/31 |
| 5,654,811 A | 8/1997 | Spitzer et al. | 349/106 |
| 5,786,937 A * | 7/1998 | Chu et al. | 359/834 |
| 6,019,474 A | 2/2000 | Doany et al. | 353/33 |
| 6,229,651 B1 | 5/2001 | Edlinger | 359/583 |
| 6,327,092 B1 | 12/2001 | Okuyama | 359/634 |
| 6,517,209 B1 | 2/2003 | Huang | 353/81 |
| 6,671,101 B1 | 12/2003 | Sugawara | 359/634 |
| 6,704,144 B1 | 3/2004 | Huang | 359/634 |
| 6,758,565 B1 | 7/2004 | Cobb et al. | 353/34 |
| 6,919,990 B1 | 7/2005 | Anikitchev et al. | 359/618 |
| 6,956,701 B1 | 10/2005 | Peterson et al. | 359/618 |

* cited by examiner

Primary Examiner—Alicia M Harrington  
(74) Attorney, Agent, or Firm—Timothy M. Schaeberle

(57) ABSTRACT

A light separator splits polychromatic light into longer and shorter wavelength spectral bands. The light separator is defined between opposing side surfaces that are reflective to incident light and further has an input side for accepting the polychromatic light and an output side for providing the separated spectral bands. A first light guiding channel narrows as it extends from the input to the output side and lies between a first dichroic surface for reflecting longer wavelengths and transmitting shorter wavelengths and a first outer surface reflective to incident light. A second light guiding channel narrows as it extends from the input to the output side and lies between a second dichroic surface for reflecting shorter wavelengths and transmitting longer wavelengths and a second outer surface reflective to incident light. A portion of the light separator is common to both first and second light guiding channels.

14 Claims, 12 Drawing Sheets

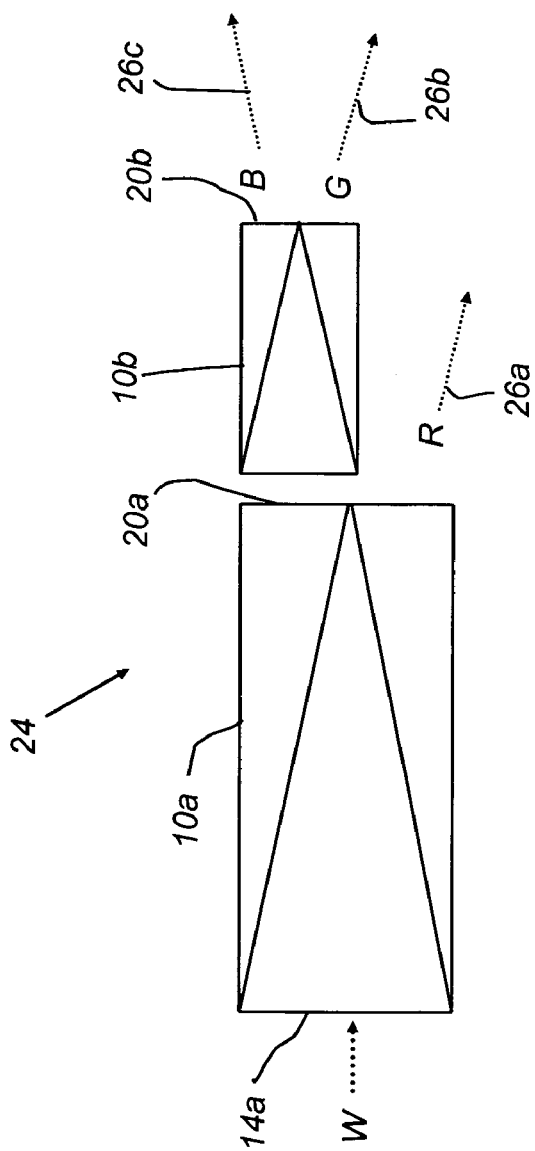

LIGHT SEPARATOR

FIELD OF THE INVENTION

This invention generally relates to apparatus for spectral separation of light and more particularly relates to an apparatus that combines spectral separation of light with spatial homogenization of light energy.

BACKGROUND OF THE INVENTION

Color separators and recombiners are well known in the optical arts and have a number of applications, particularly for displaying or recording color images. In such imaging devices, a color separator accepts polychromatic light input and splits the light according to wavelength to provide two, three, or more spectral bands of light for modulation. A color recombiner is then used to combine the spectral bands of modulated light and form a full color image thereby.

Dichroic coatings provide a useful mechanism for performing color separation in a range of applications, offering advantages such as minimal light loss and relatively good spectral selectivity. Examples of various types of color separators that employ dichroic coatings on prism surfaces include the following:

- U.S. Pat. No. 6,758,565 entitled "Projection Apparatus Using Telecentric Optics" to Cobb et al. describes the use of a dichroic separator in the form of a V-prism for separating white light into primary Red, Green, and Blue (RGB) color components;
- U.S. Pat. No. 6,671,101 entitled "Color Combining Optical Element, Color Separation Optical Element, and Projection Type Display Apparatus Using Them" to Sugawara describes a color separating and combining optical component formed from three prisms that have dichroic surfaces positioned between them;
- U.S. Pat. No. 6,517,209 entitled "Color-Separating Prism Utilizing Reflective Filters and Total Internal Reflection" to Huang describes another color separation apparatus using joined prisms with dichroic surfaces between them;
- U.S. Pat. No. 6,956,701 entitled "Method and Apparatus for Combining Light Paths of Multiple Colored Light Sources Through a Common Integration Tunnel" to Peterson et al. describes an integrating apparatus for combining multiple color light paths for illumination in a projection system;
- U.S. Pat. No. 5,098,183 entitled "Dichroic Optical Elements for use in a Projection Type Display Apparatus" to Sonehara describes the prismatic optical component using crossed dichroic surfaces that is known as the X-cube and is used in various types of imaging devices for separating white light into its RGB components;
- U.S. Pat. No. 6,327,092 entitled "Cross Dichroic Prism" to Okuyama describes a variation on X-cube design wherein opposite outer faces are not in parallel;
- U.S. Pat. No. 3,202,039 entitled "Optical System for a Color Television Camera" to DeLang et al. describes the Philips prism for color separation that has been employed in numerous projector designs, employing three prisms and a number of dichroic surfaces; and,
- U.S. Pat. No. 6,704,144 entitled "Color Separation Prism Assembly Compensated for Contrast Enhancement and Implemented as Reflective Imager" to Huang describes another embodiment of a three-prism arrangement for directing polychromatic light through various dichroic coatings to obtain separated RGB components.

With such conventional X-cube and Philips prism embodiments, polychromatic light passes through one or more dichroic surfaces and is separated into its different spectral components thereby. In most cases, the same component, or a component similarly configured, can be used for both color separation prior to modulation and for recombining modulated light for final projection or other imaging.

Combinations of dichroic surfaces with prisms, such as those exemplified by the X-cube and Philips prisms, have a number of disadvantages. The X-cube, an arrangement that combines four separate prisms with each intersecting inner surface having a corresponding dichroic coating, has proven to be difficult to manufacture inexpensively. Slight misalignment of inner surfaces can result in problems such as color fringing. Mechanical tolerances and proper alignment can also present difficulties for the fabrication of Philips prisms and related three-prism devices. Moreover, even where these problems can be corrected, X-cube and Phillips prism solutions require that light paths be split in orthogonal directions or at some other relatively pronounced angle relative to the axis of incident light. The resulting spacing constraint prevents such devices from being used in any type of array, for example.

Another significant drawback of conventional color separation devices relates to characteristics of dichroic surfaces themselves. The spectral performance of a dichroic coating is strongly influenced by the angle of incident light. As the angle of incidence varies, the wavelengths of light that are transmitted and reflected also shift somewhat. Generally, dichroic surfaces are designed to work best with incident light over a small range of angles and are typically used for incident light at near-normal angles.

In many types of devices, including imaging apparatus, there is a need to provide a uniform field of light for modulation. To achieve a uniform field, one strategy is to employ a uniformizing element that spreads the light energy by homogenizing the angular distribution and shapes the light beam, without incurring loss of light. Imaging devices, such as those used for color image display or recording as noted above, typically use components such as an integrating bar, a fly's-eye lenslet array, a fiber optic faceplate or bundle, a diffuser, or similar optical device as a uniformizing element. As just one example, U.S. Pat. No. 6,919,990 entitled "Methods and Systems for Low Loss Separation and Combination of Light" to Anikitchev et al. describes the use of an integrating bar for redistributing an illumination beam to obtain more uniform distribution of the illumination energy in a display system.

While imaging applications typically require either spectral separation or recombination of light for forming color images, there are other applications in which both spectral separation and homogenization of light energy are advantageous. Among these applications are those in which energy is obtained from light, such as in sensing apparatus and in photovoltaic energy apparatus, such as solar energy panels, for example. Various photovoltaic materials respond differently to light at different wavelengths. For this reason, it can be beneficial for a solar energy apparatus to decompose sunlight into two or more spectral bands, directing each spectral band to an appropriate material that is optimized for providing energy at that spectral band. Where sunlight can be split into higher and lower spectral bands of longer and shorter wavelengths respectively, different photovoltaic cells can be utilized to increase the overall energy yield obtained from an amount of sunlight. A first photovoltaic cell can be optimized for lower energy light, that is light at longer wavelengths. A second photovoltaic cell can then be optimized for higher energy light, that is, light at shorter wavelengths.

While it is recognized that there would be benefits to apparatus and methods for efficient spectral splitting of light, conventional solutions fall far short of what is needed for lossless splitting of light at low cost and require that a separate component be provided in order to improve spatial distribution of light energy. Thus, there is a need for an apparatus that provides lossless spectral separation with light homogenization and allows compact packaging.

SUMMARY OF THE INVENTION

It is an object of the present invention to advance the art of light separation. With this object in mind, the present invention provides a light separator for splitting a polychromatic light into a longer wavelength spectral band light above a predetermined wavelength and a shorter wavelength spectral band light below the predetermined wavelength, the light separator defined between opposing side surfaces that are each reflective to incident light over a range of angles and further having an input side for accepting the polychromatic light and an output side for providing the separated longer and shorter wavelength spectral band light, the light separator comprising:

(a) a first light guiding channel, narrowing as it extends from the input side to the output side and defined between:
 (i) a first dichroic surface for reflecting wavelengths longer than the predetermined wavelength and transmitting wavelengths shorter than the predetermined wavelength; and
 (ii) a first outer surface that is reflective to incident light over a range of angles;
and
(b) a second light guiding channel, narrowing as it extends from the input side to the output side and defined between:
 (i) a second dichroic surface for reflecting wavelengths shorter than the predetermined wavelength and transmitting wavelengths longer than the predetermined wavelength; and
 (ii) a second outer surface that is reflective to incident light over a range of angles;
further including a common portion of the light separator that is part of both first and second light guiding channels, the common portion lying between the first and second dichroic surfaces and narrowing as it extends from the input side toward the output side.

It is a feature of the present invention that it provides a mechanism for splitting light into two or more spectral band components, where the threshold wavelength can be varied by adjustment of dichroic coatings.

It is an advantage of the present invention that provides both functions of spectral splitting and light homogenization in a single component. Embodiments of the present invention can be essentially lossless, optimizing the available light energy provided in each separated spectral band.

These and other objects, features, and advantages of the present invention will become apparent to those skilled in the art upon reading the following detailed description in conjunction with the drawings, wherein there is shown and described an illustrative embodiment of the invention.

BRIEF DESCRIPTION OF THE DRAWINGS

FIG. 8 is a side view block diagram of a multi-band light separator in an alternate embodiment;

DETAILED DESCRIPTION OF THE INVENTION

The apparatus of the present invention utilizes key properties of dichroic coatings and light guiding optics to obtain essentially lossless color separation with spatial homogenization of light energy for its separated spectral components. This apparatus accepts polychromatic light, that is, light spanning a range of wavelengths that may include visible as well as infrared and ultraviolet wavelengths, such as sunlight, for example. The polychromatic light is split into longer and shorter wavelength spectral components or spectral bands, relative to some predetermined wavelength.

Figure 1:
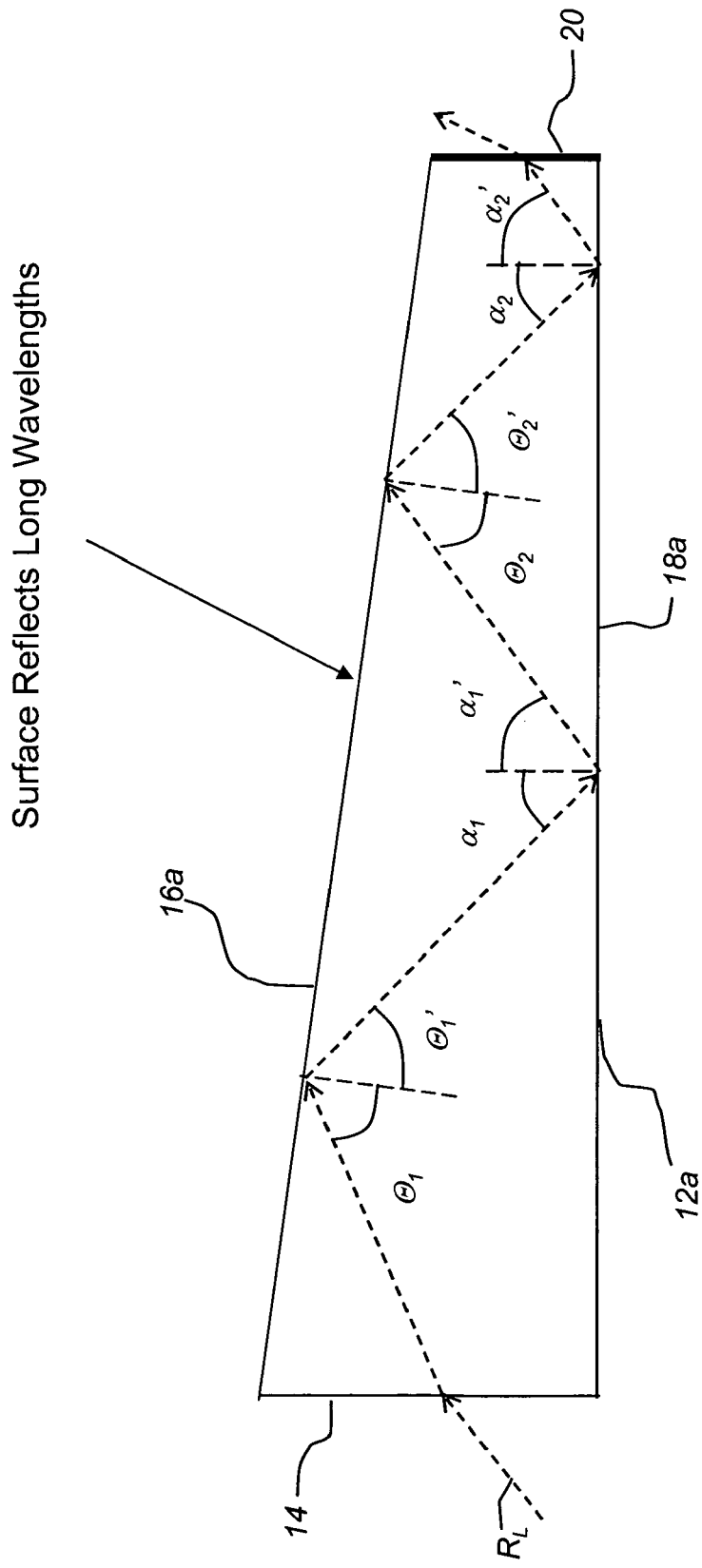
FIG. 1 is a side view block diagram of a first light guiding channel according to the present invention.
Figure 2:
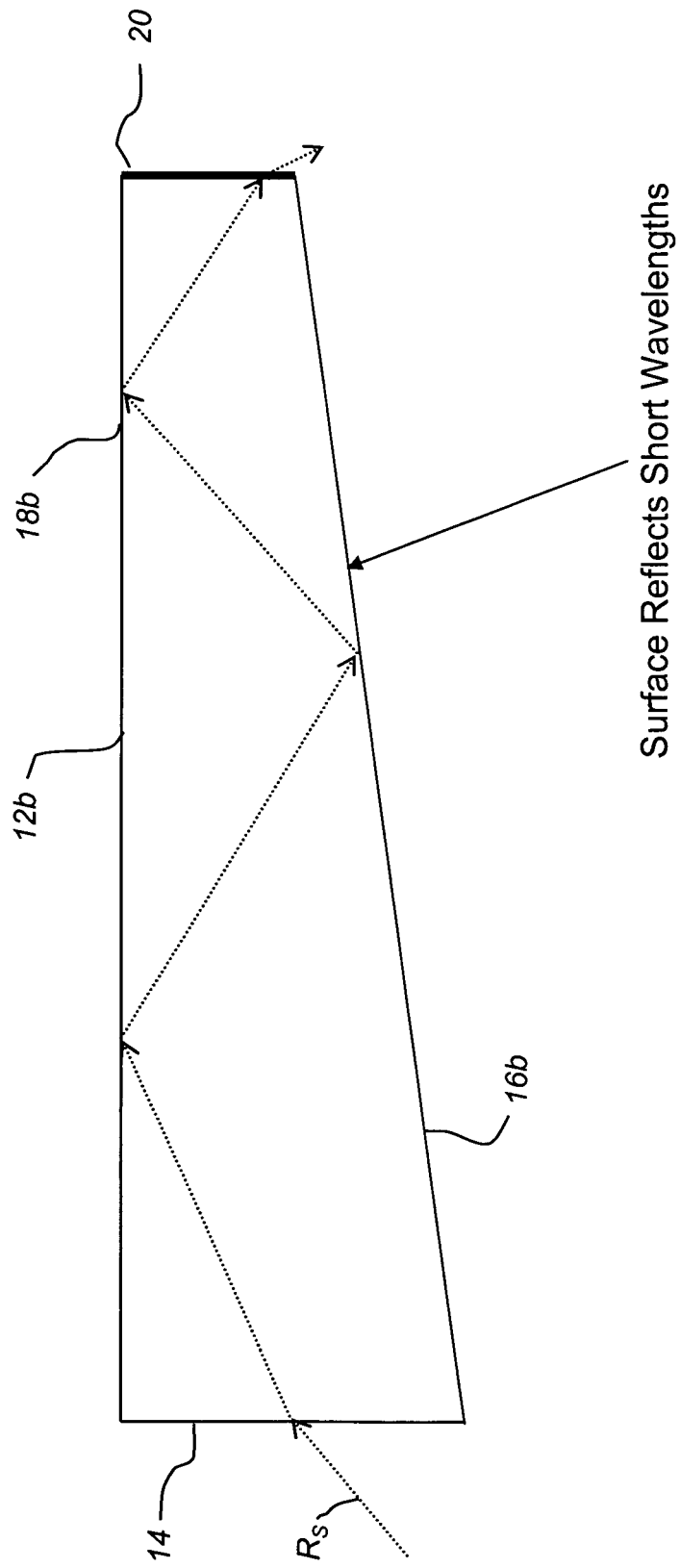
FIG. 2 is a side view block diagram of a second light guiding channel according to the present invention.

Referring first to FIGS. 1 and 2, there are shown two light guiding channels 12a and 12b respectively that are combined to form a light separator according to the present invention. In light guiding channel 12a of FIG. 1, a dichroic surface 16a is coated to reflect longer wavelengths, above the predetermined wavelength, and transmit shorter wavelengths below the predetermined wavelength toward an output side 20. A ray $R_L$ traces a typical path for light from an input side 14 having a wavelength longer than the predetermined wavelength. This light is reflected at dichroic surface 16a and again at a reflective outer surface 18a. As shown in FIG. 1, there are repeated reflections of this longer wavelength light at each of surfaces 16a and 18a. Reflective outer surface 18a could be coated with a reflective material or could use Total Internal Reflection (TIR) as described subsequently.

Because dichroic surface 16a slopes toward outer surface 18a, so that light guiding channel 12a narrows along the light path from input side 14 to output side 20, each reflection occurs at a slightly smaller angle with respect to a normal to each respective surface. With respect to FIG. 1, ray $R_L$ first strikes dichroic surface 16a at an incident angle $\theta_1$ with respect to a normal to dichroic surface 16a and is reflected at an equal reflection angle $\theta_1'$. Its next reflection is at outer surface 18a, with an incident angle of $\alpha_1$ and a reflection angle of $\alpha_1'$. Following this is a second reflection at dichroic surface 16a at an incident angle $\theta_2$ with respect to a normal to dichroic surface 16a and with an equal reflection angle $\theta_2'$. Significantly, the slope of dichroic surface 16a relative to outer surface 18a causes the following relationship:

$$\theta_1 > \theta_2$$

Moreover, where there are additional reflections on dichroic surface, each subsequent reflection is at an incident angle that is slightly less than the previous reflection, so that in general, for consecutive reflections n and (n+1):

$$\theta_n > \theta_{n+1}$$

A similar relationship holds for successive reflections at outer surface 18a. That is, due to the narrowing of light guiding channel 12a:

$$\alpha_1 > \alpha_2$$

and in general, for successive reflections:

$$\alpha_n > \alpha_{n+1}$$

As a result of these multiple reflections that occur at ever-decreasing incidence angles, the light of ray $R_L$ that exits light guiding channel 12a at output side 20 emerges at a generally higher angle than the corresponding light at input side 14. Because of this angular difference for some portion of the light directed through light guiding channel 12a, the light at output side 20 is spatially homogenized relative to the light at input side 14. Thus, light guiding channel 12a acts as both a light homogenizer, distributing light in a manner similar to that of a tapered integrating bar, and a light separating component with improved performance over other dichroic color separation devices, as is described subsequently.

Light guiding channel 12b of FIG. 2 operates and homogenizes light in a similar manner to light guiding channel 12a for light below, that is, with wavelengths shorter than, the predetermined wavelength. A dichroic surface 16b is coated to reflect shorter wavelengths and transmit higher wavelengths, again, relative to the predetermined wavelength as a type of threshold. A ray $R_S$ traces a typical path for light having a wavelength shorter than the threshold wavelength. This light is reflected at dichroic surface 16b and again at a reflective outer surface 18b. There can be repeated reflections at each of surfaces 16b and 18b. Because dichroic surface 16b slopes toward outer surface 18b, each subsequent reflection occurs at a slightly smaller angle with respect to a normal to each respective surface. As a result of these multiple reflections, the light of ray $R_S$ that exits light guiding channel 12b at an output side 20 is at a generally higher angle than the corresponding light at input side 14. This light mixing by the tapered light guiding channel 12b provides a measure of spatial homogenization to light at output side 20. Thus, light guiding channel 12b also acts as a light homogenizer, as well as a light separating component.

The above descriptions of FIGS. 1 and 2 emphasized the significance of the angular relationships of the paired surfaces that define each light guiding channel 12a and 12b for light homogenization. This is only one benefit of the geometry of light guiding channels 12a and 12b. Another key benefit relates to improved color separation as light is repeatedly incident on the dichroic surface and at continually reduced angles. As noted in the background section given earlier, it is well known that variations in dichroic performance are reduced with decreased incident angle. Thus, with reference to ray $R_L$ in FIG. 1 for example, each time the light is incident on dichroic surface 16a, the color separating operation of the dichroic coating is repeated. Moreover, with each iteration, the incident angle is more and more favorable. Using this behavior, light separator 10 of the present invention is able to achieve a high degree of color separation. This multiple-pass incidence of light against dichroic surface 16a, made possible by forming the narrowing channel as described hereinabove, distinguishes light separator 10 of the present invention from conventional X-cubes, Philips prisms, and related dichroic color separation devices that provide only a single pass of the light through a dichroic surface.

Figure 3:
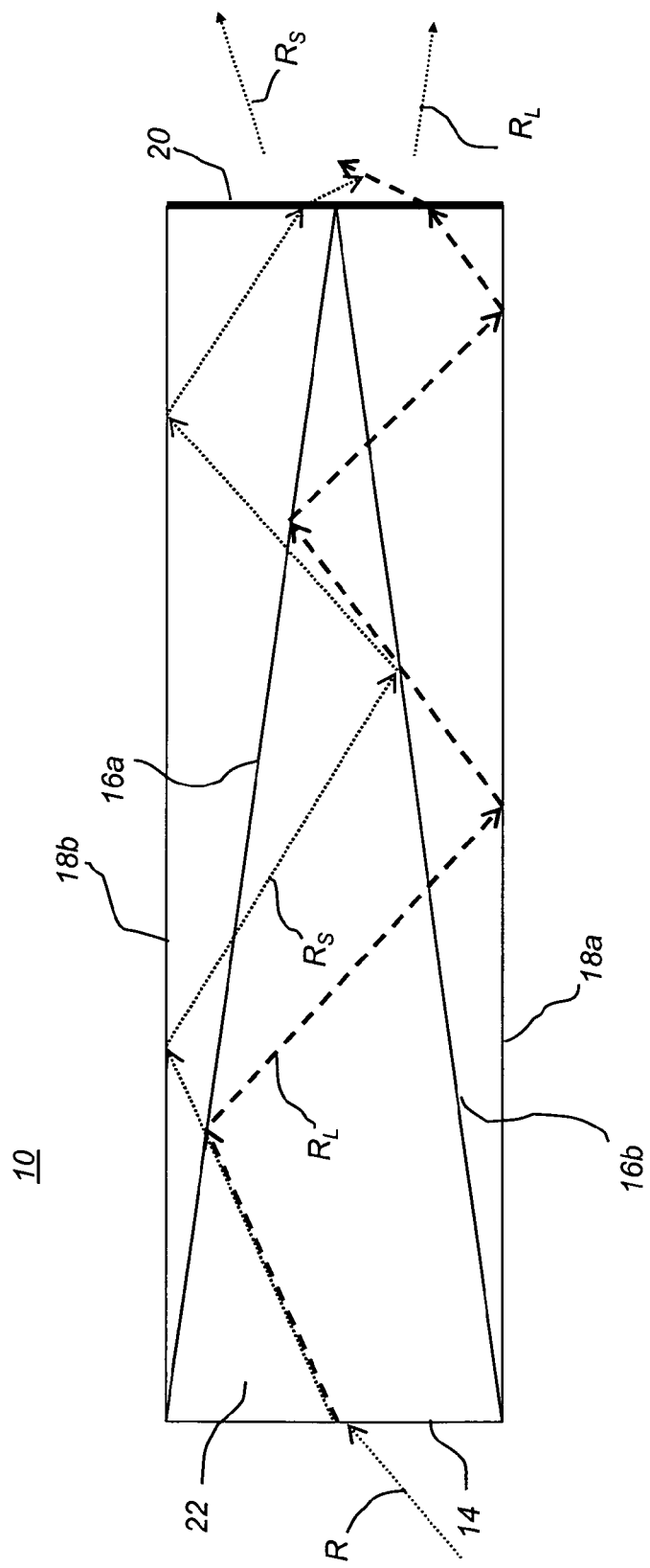
FIG. 3 is a side view block diagram of the light separator of the present invention, formed by combining the light guiding channels of FIGS. 1 and 2.

The side view block diagram of FIG. 3 shows the combined operation of light guiding channels 12a and 12b in a light separator 10. Here, polychromatic light, shown at a ray R, is initially split into long and short wavelength components $R_L$, $R_S$ at dichroic surface 16a. Then, each component is subsequently reflected multiple times until it emerges as spectrally separated light at output 20. As shown in the side view of FIG. 3, there is a common portion 22 of light separator 10 that lies between dichroic surfaces 16a and 16b and is part of both light guiding channel 12a and light guiding channel 12b. Common portion 22 is widest at input side 14, typically as wide as input side 14 as it appears in FIG. 3, and narrows as it extends toward output side 20. Common portion 22 only exists between dichroic surfaces 16a and 16b.

Figure 4:
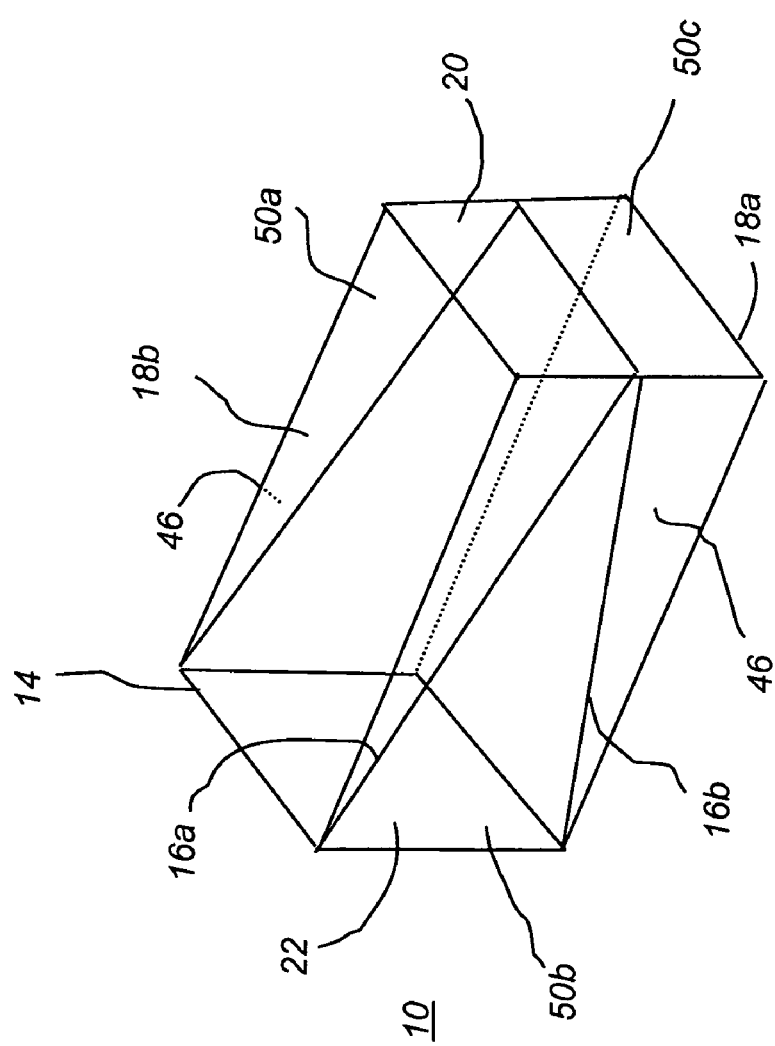
FIG. 4 is a perspective view showing external surfaces of the light separator of the present invention.

Not visible in the cutaway side views of FIG. 1, 2, or 3 are opposing side surfaces of light separator 10 that are also reflective to incident light over a range of angles and provide light-guiding surfaces, portions of which are used by each light guiding channel 12a and 12b. For reference, the perspective view of FIG. 4 shows, the relative positions of outer surfaces of light separator 10 in one embodiment. From this perspective, top and bottom surfaces of light separator 10 are outer surfaces 18b and 18a, respectively. One of opposing side surfaces 46 is visible from this angle; another side surface 46 is opposite.

In the embodiment of FIG. 4, light separator 10 is fabricated using a combination of three prisms 50a, 50b, and 50c, each triangular in the cross section direction used in FIGS. 1–3, with the necessary dichroic coatings applied to the various prism surfaces. TIR is employed for reflection at outer surfaces 18a and 18b as well as for reflection at opposing side surfaces 46. Common portion 22 corresponds to the volume of the enclosed prism 50b.

In one embodiment, as shown in FIG. 4, outer surfaces 18a and 18b are substantially parallel to each other, a typical arrangement for a prism embodiment as is represented in the cross-sectional view of FIG. 3. However, this relationship is not necessary and there may be applications where it is advantageous to make outer surfaces 18a and 18b mutually non-parallel. Dichroic surfaces 16a and 16b typically intersect only at or near output side 20 and do not cross. However, dichroic surfaces 16a and 16b need not precisely intersect for proper operation of light separator 10. If dichroic surfaces 16a and 16b do happen to cross each other near output side 20, any portion of light separator 10 that lies between dichroic surfaces 16a and 16b after the intersection would not be useful for the color-separating function of this apparatus. While dichroic surfaces 16a and 16b are shown as having (with respect to a central axis) complementary slopes so that these surfaces extend from opposite corners of input side 14 to the center of output side 20 as viewed in cross section, other arrangements are possible. For example, the respective volumes of light guiding channels 12a and 12b need not be equal.

As shown in the embodiment shown in FIG. 4, light separator 10 can be a prism structure, formed of glass, plastic, or other suitable transparent material and having dichroic coatings on the inner portions of dichroic surfaces 16a and 16b. In a prism embodiment, outer surfaces 18a and 18b typically reflect incident light using Total Internal Reflection (TIR), a behavior well known in the light guiding arts and widely used, for example, in integrating bars that serve as uniformizing elements. Optionally, portions of one or more of outer surfaces 18a, 18b or opposing surfaces 46 of the prism structure can be coated with a reflective material. TIR is advantaged because it is essentially lossless when light is provided at the proper incident angles. With coated material reflection, on the other hand, there is some loss with each reflection, so that multiple reflections can cause an appreciable amount of energy loss. However, there may be other reasons for providing a reflective surface material on at least some portion of outer surfaces 18a and 18b.

Figure 5:
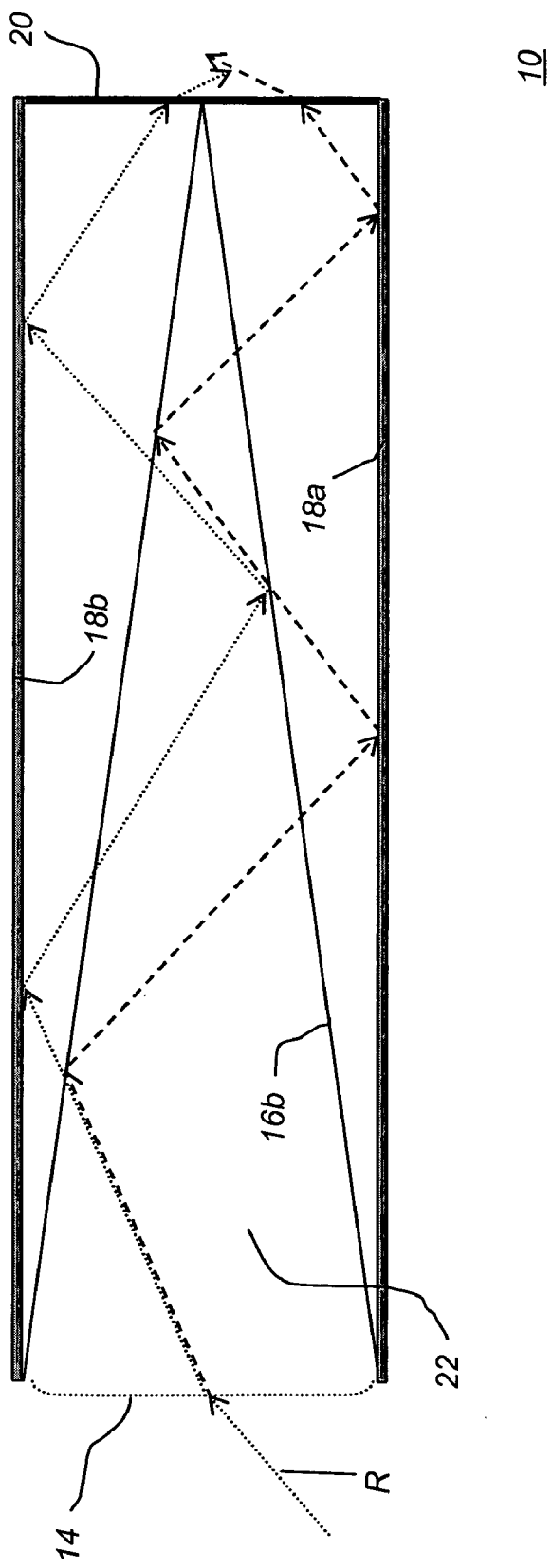
FIG. 5 is a side view block diagram of a light separator according to an alternate embodiment.

An alternative to prism-based embodiments is shown in the example of FIG. 5. With this embodiment, input side 14 is open in air. Reflective outer surfaces 18a and 18b must then be provided with some type of reflective coating. A reflective coating would also be used for opposing side surfaces 46, not visible in the cutaway side view of FIG. 5. In the embodiment of FIG. 5, common portion 22 is simply that air space that lies between dichroic surfaces 16a and 16b.

Series Embodiments

Figure 6:
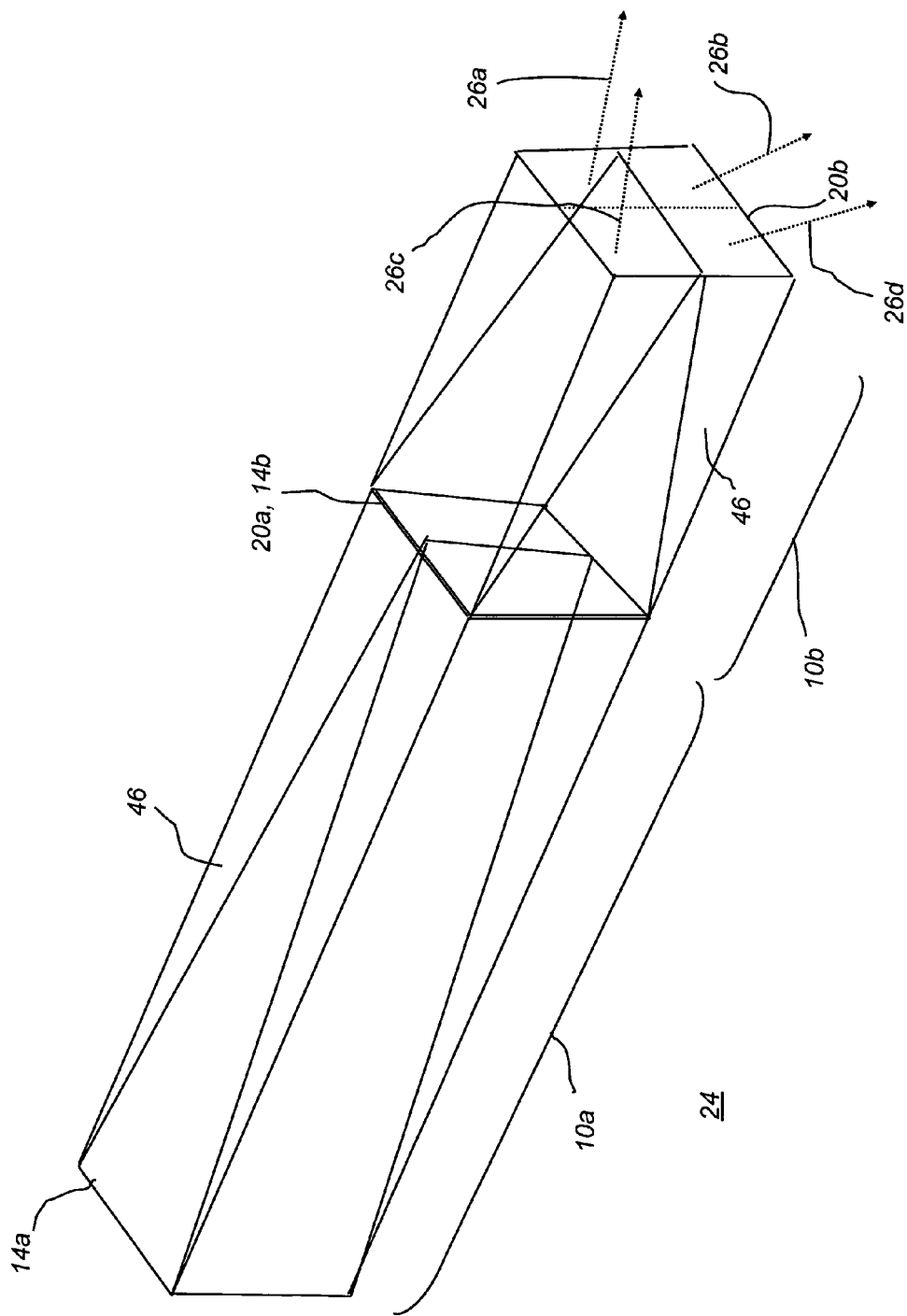
FIG. 6 is a perspective view of a multi-band light separator using a series of light separators in one embodiment.

While the embodiments shown in FIGS. 3, 4, and 5 provide apparatus that split light into two spectral bands, there are, of course, many applications that would require that light be separated into three, four, or more spectral bands. In order to achieve this, a series arrangement can also be used for obtaining a multi-band light separator 24, as is shown in the perspective views of FIGS. 6 and 7 and the block diagram of FIG. 8. Referring to FIG. 6, a light separator 10a first splits incident light at an input side 14a into longer and shorter wavelength spectral band components, available at an output side 20a. Output side 20a is then optically coupled to an input side 14b of a second light separator 10b. Second light separator 10b is axially rotated by 90 degrees from first light separator 10a, so that each spectral band component provided from first light separator 10a is again split into longer and shorter wavelength spectral bands. As a result, the light output at an output side 20b has four spectral bands, indicated as 26a, 26b, 26c, and 26d in FIG. 6.

Figure 7:
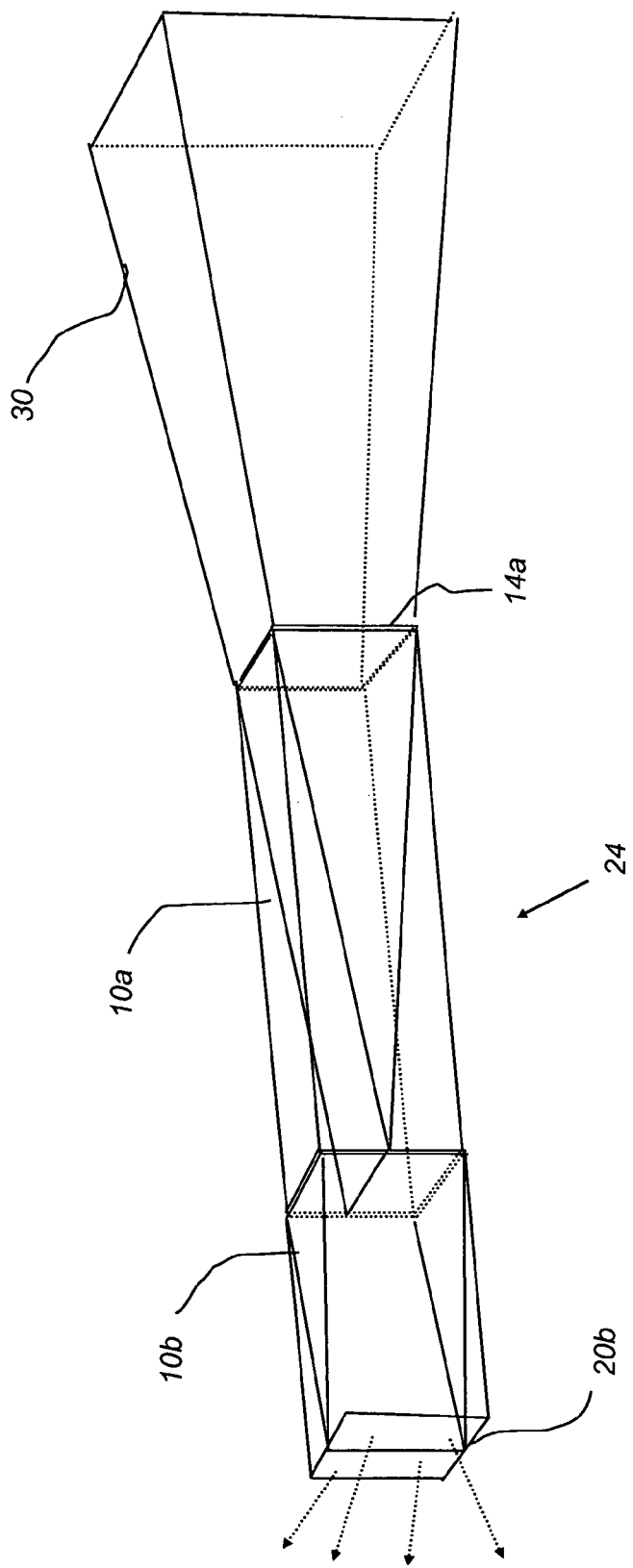
FIG. 7 is a perspective view of the multi-band light separator of FIG. 6 from an alternate angle and with an added optical concentrator.

FIG. 7 shows, from a different perspective angle, multi-band light separator 24 coupled with a tapered integrating bar 30 provided as an optical concentrator. This embodiment allows spectral separation of light with magnification, an arrangement that may have particular value for collecting and distributing spectral components of solar or other photovoltaic energy. As an alternative to tapered integrating bar 30, a focusing lens could be employed as an optical concentrator. The lens would have a larger diameter than input side 14a of light separator 10a.

The side view block diagram of FIG. 8 shows another alternative embodiment for spectral separation using series light separators 10a and 10b. Here, multi-band separator 24 is configured to accept white light W at input side 14a and to output RGB light, with each spectral band spatially homogenized. First light separator 10a separates the red spectral component from blue and green light. This blue and green light at output side 20a is optically coupled to light separator 10b which performs an additional separation of blue from green light.

Array Embodiments

While the apparatus of the present invention can be used singly as a light separator, such as for an illumination system in a range of imaging devices, there are applications for which an array arrangement would be advantaged, including arrays of miniaturized light separator components, each light separator designed according to the present invention.

Figure 9A:
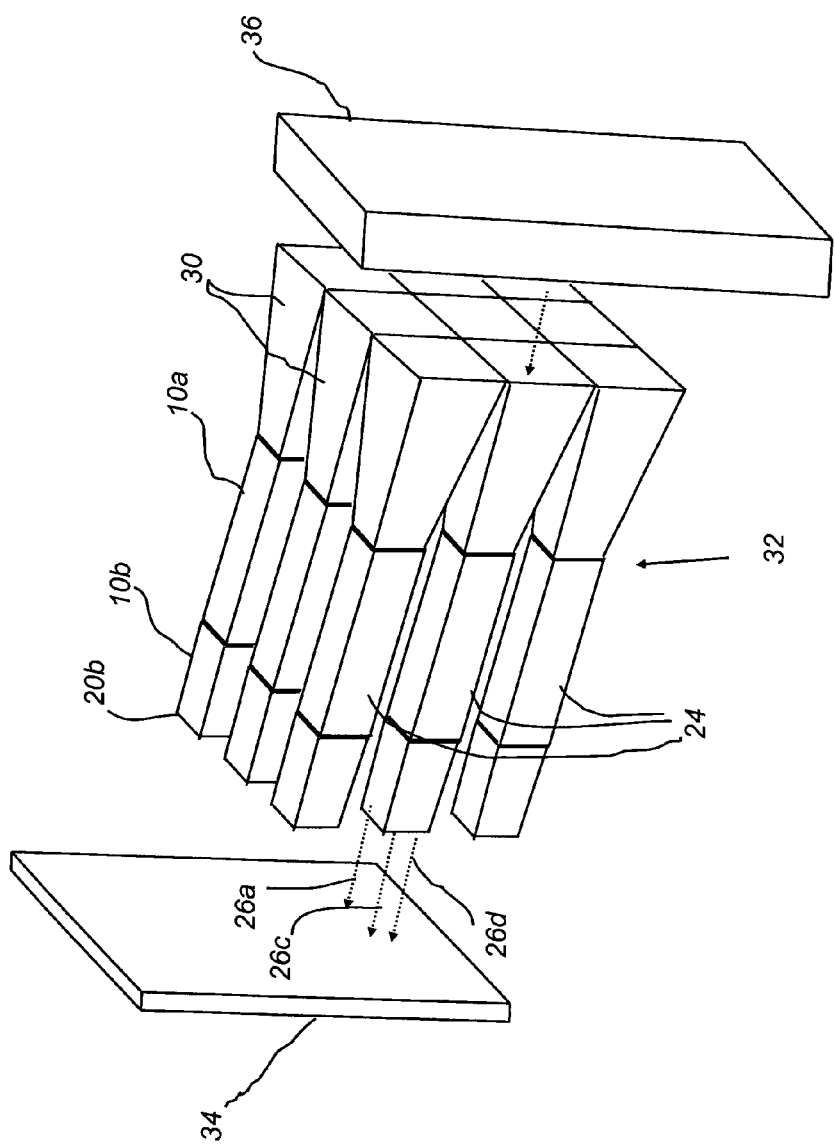
FIGS. 9A and 9B are perspective views, from different angles, of an array of multi-band light separators.
Figure 9B:
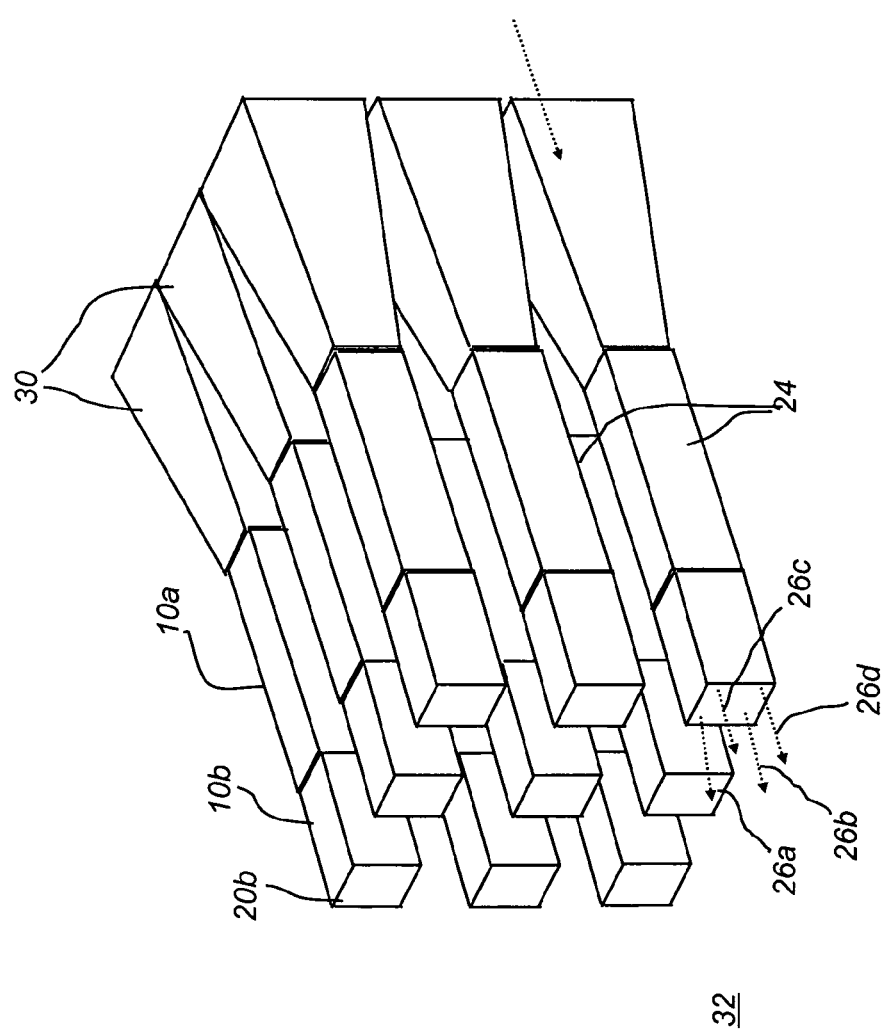

Referring to FIGS. 9A and 9B, there is shown, from two different perspective views, an array 32 of multi-band light separators 24. FIGS. 9A and 9B show a 3×3 arrangement for array 32; in practice, array 32 could be of any arbitrary dimensions, based on the application. Of course, a simpler array of light separators 10 could be constructed where it is only necessary to split light into two spectral components at each array component.

Polychromatic light, such as light entering from a light-providing surface 36 or other source of polychromatic light on the right in FIGS. 9A and 9B, is directed to one of multi-band separators 24 in array 32. In the embodiment shown, each multi-band separator 24 is coupled with a corresponding tapered integrating bar 30 so that output light in spectral bands 26a, 26b, 26c, and 26d is effectively magnified at output side 20b. In FIG. 9A, the separated light is directed to a light-receiving surface 34, which could use the separated spectral bands for display purposes or (without light-providing surface 36) for energy generation. The particular embodiments shown in FIGS. 9A and 9B may be advantageous, for example, when multi-band separators 24 are optically coupled with a corresponding array of photovoltaic cells, such as arranged on a single light-receiving surface 34 in a solar collection apparatus or arranged as separate devices. As was noted earlier, photovoltaic materials in the respective photovoltaic cells could be optimized to handle each available spectral component of spectral bands 26a, 26b, 26c, and 26d.

For a display device, using the arrangement shown in FIG. 9A, light-providing surface 36 could be a backlight apparatus. Light-receiving surface 34 could be a light-gating device, such as a liquid-crystal device (LCD), digital micromirror device, or some other type of spatial light modulator in which individual light-gating elements modulate light. With reference to display embodiments using the basic arrangement of FIG. 9A, array 32 of light separators 10a, 10b could be fabricated onto a thin sheet of material, such as glass or film. In miniaturized form, array 32 of light separators 10 could provide spatially homogenized, spatially separated visible color light in conventional RGB spectral bands, or providing three or more colors. Each spectral band is directed to a light-gating element on light-receiving surface 34 for modulation. Employed in this way, array 32 could be used in place of a conventional color filter array (CFA), such as that described in U.S. Patent Application Publication No. 2004/0257541 by Iisaka, for example. Capability for providing an additional color, without added components or filters, could serve to increase available color gamut. Array 32 would have the advantage of increased light output over conventional CFAs that use absorptive color filters.

It can be observed that the design of light separator 10 is readily adaptable to both series configurations and array configurations, as are shown in FIGS. 6 through 9B. This is unlike any conventional type of dichroic color separator such as those noted earlier in the background section. The series and/or array capability is made possible because light separator 10 directs the separated light generally along the same axis as that of the input light. Light separator 10 thus provides a "narrow profile" device for spectral splitting without redirecting the light orthogonally or at some other extreme angle relative to the optical axis of incident light.

Solar Collection Embodiments

Figure 11:
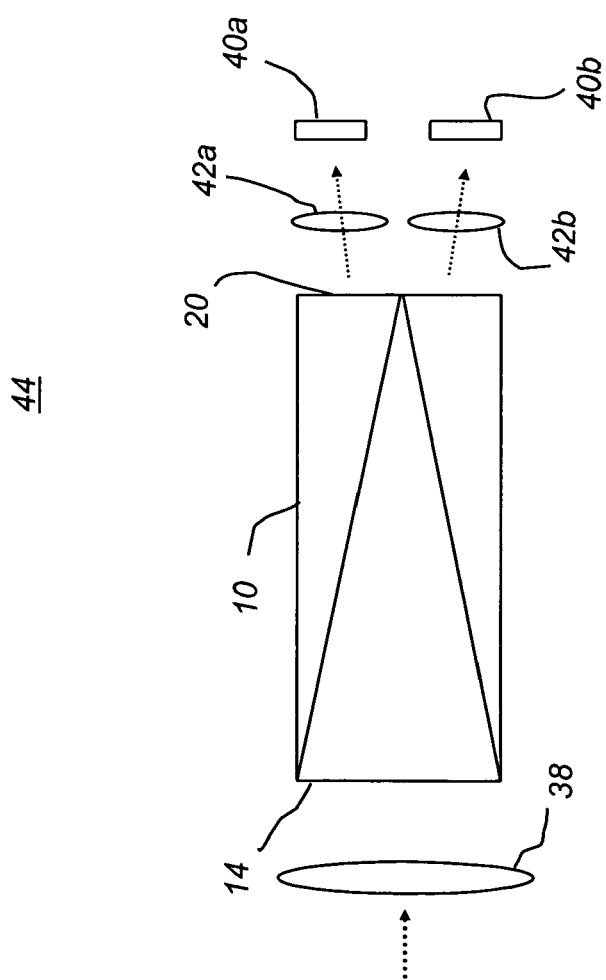
FIG. 11 is a schematic diagram showing a solar energy converter using the light separator of the present invention.

Referring to FIG. 11, there is shown a solar collection apparatus 44 for generating electrical energy from the sun or another radiant source. A magnifying lens 38 or other optical concentrator directs the light to light separator 10. The input diameter of lens 38 is preferably larger than the dimensions of input side 14. Light separator 10 splits the light into a longer wavelength spectral band and a shorter wavelength spectral band. Each spectral band is then directed to a photovoltaic cell 40a or 40b, typically using an optional lens 42a, 42b as an optical concentrator for coupling the light in each spectral band to the corresponding photovoltaic cell 40a or 40b. This arrangement would be advantageous, for example, where different materials are used in photovoltaic cells 40a and 40b, each optimized for a different wavelength band. In this way, the apparatus of the present invention provides an alternative to the conventional stacked photovoltaic cell solution that is often used in solar collection devices, such as that described in U.S. Pat. No. 2,949,498 entitled "Solar Energy Converter" to Jackson.

Practical Considerations

As can be appreciated by those skilled in the optical arts, the behavior of light described with reference to FIGS. 1, 2, and 3 is an idealized first approximation. The actual behavior of dichroic coatings is, of course, less than perfect. In practice, there will be some amount of spectral contamination in each component of separated light. It is instructive to take a closer look at the behavior of light in order to better understand the overall performance of the apparatus and methods of the present invention.

Figure 10:
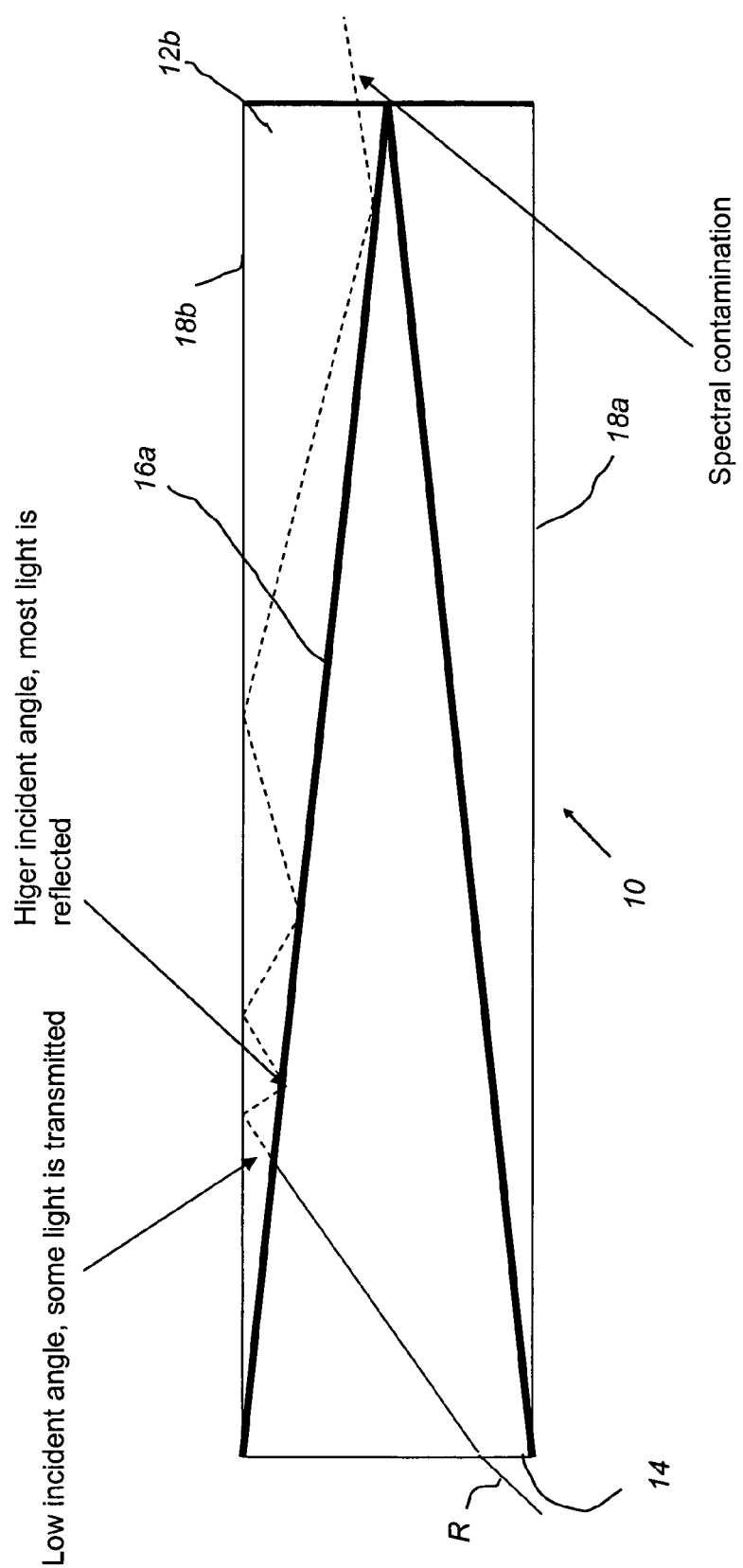
FIG. 10 is a side view block diagram showing light handling behavior of the light separator where a small amount of leakage between channels can occur.

As was noted earlier, dichroic coatings are sensitive to incident light angle, so that some spectral contamination could be expected at wavelengths near the predetermined threshold wavelength, depending, in part, on incident light angles. Referring to FIG. 10, there is shown how dichroic surface 16a, treated to form an infrared reflector in this embodiment, handles light at high incidence angles. Some amount of spectral contamination can occur over a range of incident angles, particularly for IR light. As shown in FIG. 10, some amount of IR leakage may occur at dichroic surface 16a, even at a low incident angle. This light, shown by a dashed line, is reflected from output surface 18b and thus redirected toward dichroic surface 16a. At its next incidence on dichroic surface 16a, the light is at a higher incident angle; however, most of the unwanted light is reflected. Repeated incidence at both output surface 18b and dichroic surface 16a is at higher and higher incident angles, so that even though this unintended reflection is continually less efficient, there is still some amount of leakage light that remains "trapped" in light guiding channel 12b.

Another practical consideration relates to the imperfect filter characteristics of dichroic coatings themselves. With respect to light separator 10 of the present invention, some predetermined wavelength is specified as a reference or threshold frequency for reflection and transmission at dichroic surfaces 16a and 16b. With reference to FIG. 3, for example, it may be desirable to split the polychromatic light so that the longer wavelength spectral band light $R_L$ is in the near-IR range and higher (nominally, about 750 nm and longer wavelengths). The shorter wavelength spectral band light $R_S$ would then contain wavelengths in the visible range and shorter. For this example, dichroic surface 16a would be treated to reflect near IR and longer wavelengths, with a nominal threshold wavelength of 750 nm and to transmit wavelengths beneath this threshold wavelength. Conversely, dichroic surface 16b would be fabricated to reflect wavelengths shorter than 750 nm and to transmit longer wavelengths.

As is well known, it is generally difficult, in practice, to obtain a dichroic coating that offers a very sharp transition between transmission and reflection at any given wavelength. Thus, the predetermined wavelength that is used as the nominal threshold wavelength, 750 nm in this example, serves as a reference point, but not as an absolute "cutoff" threshold. That is, there is likely to be some spectral range, such as 740–760 nm, over which there is some measurable distribution of light in each output path, $R_L$ and $R_S$, so that the two spectral bands overlap somewhat. Careful selection of the threshold wavelengths for each dichroic surface 16a and 16b can help to compensate for an overlap between longer and shorter wavelength spectral bands. However, some slight overlap is to be expected.

Dichroic surfaces can also be used to provide polarized light. For example, reflective dichroic surfaces can provide s-polarized output that is spectrally separated at output side 20, where the p-polarized output is not used.

Fabrication

As was noted with reference to FIG. 4, light separator 10 can be fabricated using a combination of prisms with the necessary dichroic coatings applied to the various prism surfaces. Glass or optical plastics could be used for forming any of the prism elements. Advantageously, the same prism geometry can be used with different dichroic treatments. Thus, changing the spectral characteristics of light separator 10 can be accomplished by changing the dichroic formulation without requiring that different prism shapes be used. In other embodiments, such as the embodiment shown in FIG. 5, light separator 10 can be formed by mounting suitable dichroic and reflective components that provide the needed surfaces. As described with reference to FIGS. 9A and 9B, fabrication of light separators 10 onto plastic or glass in miniaturized array form could be useful in various types of display embodiments.

Opposing side surfaces 46, as shown in FIGS. 4 and 6, can be side surfaces of a prism, where these surfaces are in parallel. However, side surfaces 46 need not be in parallel, but could be tapered, either narrowing from input side 14 to output side 20 or widening. Tapering of side surfaces 46 and outer surfaces 18a and 18b could be used to provide magnification or to shape the output light. Side surfaces 46 can be planar, as shown in FIGS. 4 and 6, or could be formed of more than one facet or have one or more curved portions.

It is instructive to note that dichroic color separators, as the term is conventionally used for X-cubes, Philips prisms, and similar components, are also used as color combiners in many applications. With light traveling in a direction reversed from that used in the exemplary embodiment of FIG. 3, for example, light separator 10 of the present invention could be used to form polychromatic light by combining longer and shorter wavelength components of light.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, dichroic surfaces can be formulated for a range of predetermined threshold wavelength conditions in addition to separation of IR from visible light as shown in the example embodiments herein. Supplemental filters, polarizers, lenses, or other light conditioning components could be added to the optical path for conditioning or redirecting either the input polychromatic light or the output spectral components.

Thus, what is provided is an apparatus and method for spectral separation of light with spatial homogenization.

PARTS LIST 10, 10a, 10b. Light separator
12a, 12b. Light guiding channel
14, 14a, 14b. Input side
16a, 16b. Dichroic surface
18a, 18b. Outer surface
20. Output side
22. Common portion
24. Multi-band light separator
26a, 26b, 26c, 26d. Spectral band
30. Integrating bar
32. Array
34. Light-receiving surface
36. Light-providing surface
38. Lens
40a, 40b. Photovoltaic cell
42a, 42b. Lens
44. Solar collection apparatus
46. Side surface
50a, 50b, 50c. Prism
$R, R_L, R_S, R_1, R_2, R_3$ Ray
$\theta_1, \theta_1', \theta_2, \theta_2', \alpha_1, \alpha_1', \alpha_2, \alpha_2'$. Angle

I claim:

1. A light separator for splitting a polychromatic light into a longer wavelength spectral band light above a predetermined wavelength and a shorter wavelength spectral band light below the predetermined wavelength, the light separator defined between opposing side surfaces that are each reflective to incident light over a range of angles and further having an input side for accepting the polychromatic light and an output side for providing the separated longer and shorter wavelength spectral band light, the light separator comprising:

(a) a first light guiding channel, narrowing as it extends from the input side to the output side and defined between:
      (i) a first dichroic surface for reflecting wavelengths longer than the predetermined wavelength and transmitting wavelengths shorter than the predetermined wavelength; and
      (ii) a first outer surface that is reflective to incident light over a range of angles;

and (b) a second light guiding channel, narrowing as it extends from the input side to the output side and defined between:
      (i) a second dichroic surface for reflecting wavelengths shorter than the predetermined wavelength and transmitting wavelengths longer than the predetermined wavelength; and
      (ii) a second outer surface that is reflective to incident light over a range of angles;

further including a common portion of the light separator that is part of both first and second light guiding channels, the common portion lying between the first and second dichroic surfaces and narrowing as it extends from the input side toward the output side.

2. The light separator of claim 1 wherein the first outer surface is coated with a reflective material.

3. The light separator of claim 1 wherein the first outer surface is a facet of a prism.

4. The light separator of claim 1 wherein the first outer surface reflects the incident light by total internal reflection.

5. The light separator of claim 1 wherein light at the output side of at least one of the first or second light guiding channels is polarized.

6. The light separator of claim 1 wherein the first dichroic surface is formed onto the face of a prism.

7. The light separator of claim 1 wherein the first dichroic surface is formed onto a plate of transparent material.

8. The light separator of claim 1 wherein the light separator is formed from three prisms.

9. The light separator of claim 1 further comprising an optical concentrator for directing the polychromatic light into the input side.

10. The light separator of claim 9 wherein the optical concentrator is a lens.

11. The light separator of claim 9 wherein the optical concentrator is a tapered light guide.

12. The light separator of claim 1 wherein the longer wavelength spectral band light is directed toward a first photovoltaic cell and the shorter wavelength spectral band light is directed toward a second photovoltaic cell.

13. The light separator of claim 1 wherein the opposing side surfaces are parallel to each other.

14. The light separator of claim 1 wherein the opposing side surfaces are tapered with respect to each other.

* * * * *